(12) United States Patent
Lin

(10) Patent No.: US 10,879,899 B2
(45) Date of Patent: Dec. 29, 2020

(54) CLOCK BUFFER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 344 days.

(21) Appl. No.: 15/677,240

(22) Filed: Aug. 15, 2017

(65) Prior Publication Data
US 2019/0058473 A1 Feb. 21, 2019

(51) Int. Cl.
| H03K 19/003 | (2006.01) |
| G06F 1/10 | (2006.01) |
| H03K 19/017 | (2006.01) |
| H03K 3/354 | (2006.01) |
| H03K 19/0948 | (2006.01) |

(52) U.S. Cl.
CPC ........ H03K 19/00361 (2013.01); G06F 1/10 (2013.01); H03K 3/3545 (2013.01); H03K 19/01721 (2013.01); H03K 19/0948 (2013.01)

(58) Field of Classification Search
CPC .. G06F 1/10; H03K 3/3545; H03K 19/00361; H03K 19/01721
See application file for complete search history.

(56) References Cited

U.S. PATENT DOCUMENTS

| 4,754,170 | A | * | 6/1988 | Toda | H03K 19/00315 |
| | | | | | 326/27 |
| 4,783,603 | A | * | 11/1988 | Goforth | H03K 19/00361 |
| | | | | | 326/33 |
| 4,972,100 | A | * | 11/1990 | Lim | H03K 17/163 |
| | | | | | 326/86 |
| 5,179,298 | A | * | 1/1993 | Hirano | H03K 17/162 |
| | | | | | 326/27 |
| 5,513,389 | A | * | 4/1996 | Reeser | H03F 1/3211 |
| | | | | | 330/268 |

(Continued)

FOREIGN PATENT DOCUMENTS

TW 201701591 A 1/2017

OTHER PUBLICATIONS

TW Office Action dated Jun. 15, 2018 in Taiwan application (No. 106145595).

*Primary Examiner* — Kurtis R Bahr
(74) *Attorney, Agent, or Firm* — McClure, Qualey & Rodack, LLP

(57) ABSTRACT

An apparatus includes: a first inverter configured to receive a first clock signal and output a second clock signal, wherein an input pin, an output pin, a power pin, and a ground pin of the first inverter connect to the first clock signal, the second clock signal, a first source node, and a second source node, respectively; a second inverter configured to receive the second clock signal and output a third clock signal, wherein an input pin, an output pin, a power pin, and a ground pin of the second inverter connect to the second clock signal, the third clock signal, the first source node, and the second source node, respectively; a first resistor connected to a first DC (direct-current) voltage to the first source node; and a second resistor connected to a second DC voltage to the second source node.

8 Claims, 3 Drawing Sheets

(56) References Cited

U.S. PATENT DOCUMENTS

| | | | | |
|---|---|---|---|---|
| 6,144,217 | A  * | 11/2000 | Iwata | H03K 19/00361 |
| | | | | 326/26 |
| 7,839,195 | B1 * | 11/2010 | Feng | H03K 5/156 |
| | | | | 327/175 |
| 9,503,067 | B1 * | 11/2016 | Lin | H03K 19/0948 |
| 9,647,669 | B1 * | 5/2017 | Chakraborty | H03K 23/44 |
| 9,866,332 | B2 * | 1/2018 | Oh | H04B 15/005 |
| 2008/0191751 | A1 * | 8/2008 | Oh | H03K 7/08 |
| | | | | 327/114 |
| 2015/0071013 | A1 * | 3/2015 | Sato | G11C 7/1057 |
| | | | | 365/189.11 |

* cited by examiner

US 10,879,899 B2

CLOCK BUFFER AND METHOD THEREOF

BACKGROUND OF THE INVENTION

Field of the Invention

The present disclosure generally relates to clock buffer circuits and more particularly to a clock buffer circuits having improved noise immunity and related methods.

Description of Related Art

A clock signal cyclically toggles between a low level and a high level. A clock signal functionally conveys timing information. A clock buffer is a circuit configured to receive an arriving clock signal and output a delayed clock signal accordingly, such that the delayed clock signal is functionally the same as the arriving clock signal, except for a delay in timing and potentially drive power. As depicted in FIG. 1A, a conventional prior art clock buffer 100 comprises a first inverter 101 and a second inverter 102 configured in a cascade topology. The first inverter 101 receives an arriving clock signal CK and outputs an inverted clock signal CKB, while the second inverter 102 receives the inverted clock signal CKB and outputs a delayed clocks signal CKD. Throughout this disclosure, "VDD" denotes a first DC (direct current) node, also known as a power node, and "VSS" denotes a second DC node, also known as a ground node. Both notations are widely used in the prior art and need not be further explained.

Both the first inverter 101 and the second inverter 102 have a respective input pin labeled by "I," a respective output pin labeled by "O," a respective power pin labeled by "P," and a respective ground pin labeled by "G." The input, the output, the power, and the ground pins of the first inverter 101 connect to CK, CKB, VDD, and VSS, respectively. The input, the output, the power, and the ground pins of the second inverter 102 connect to CKB, CKD, VDD, and VSS, respectively.

FIG. 1B depicts a schematic diagram of an inverter 110 that can be instantiated to embody the first inverter 101 and the second inverter 102. Inverter 110 comprises a NMOS (n-channel metal oxide semiconductor) transistor 112 and a PMOS (p-channel metal oxide semiconductor) transistor 111 configured in a complementary topology. The gate, the source, and the drain of the PMOS transistor 111 connect to the input pin "I," the power pin "P," and the output pin "O," respectively. The gate, the source, and the drain of the NMOS transistor 112 connect to the input pin "I," the ground pin "G," and the output pin "O," respectively. Clock buffer 100 and inverter 110 are both well known to those of ordinary skill in the art and thus not described in detail here.

Clock buffer 100 is susceptible to noises. As is known, noise from the power supply node "VDD" and/or the ground node "VS S" can adversely degrade the integrity of the delayed clock signal CKD via transistors therein (i.e. PMOS transistors 111 and/or NMOS transistors 112). In addition, transistors therein also contribute noises and consequently degrade the integrity of the delayed clock signal CKD.

What is desired is a clock buffer circuit that provides better noise immunity.

BRIEF SUMMARY OF THIS INVENTION

In an embodiment, a clock buffer circuit includes: a first inverter configured to receive a first clock signal and output a second clock signal, wherein an input pin, an output pin, a power pin, and a ground pin of the first inverter connect to the first clock signal, the second clock signal, a first source node, and a second source node, respectively; a second inverter configured to receive the second clock signal and output a third clock signal, wherein an input pin, an output pin, a power pin, and a ground pin of the second inverter connect to the second clock signal, the third clock signal, the first source node, and the second source node, respectively; a first resistor connected to a first DC (direct-current) voltage to the first source node; and a second resistor connected to a second DC voltage to the second source node. In an embodiment, the first inverter includes a PMOS (p-channel metal oxide semiconductor) transistor and a NMOS (n-channel metal oxide semiconductor) transistor, wherein a gate terminal and a source terminal of the PMOS transistor connect to the input pin and the power pin of the first inverter, respectively, while a gate terminal and a source terminal of the NMOS transistor connect to the input pin and the ground pin of the first inverter, respectively. In an embodiment, the second inverter includes a PMOS (p-channel metal oxide semiconductor) transistor and a NMOS (n-channel metal oxide semiconductor) transistor, wherein a gate terminal and a source terminal of the PMOS transistor connect to the input pin and the power pin of the second inverter, respectively, while a gate terminal and a source terminal of the NMOS transistor connect to the input pin and the ground pin of the second inverter, respectively. In an embodiment, the second inverter is substantially identical to the first inverter.

In an embodiment, a method comprises: incorporating a first inverter configured to receive a first clock signal and output a second clock signal, wherein an input pin, an output pin, a power pin, and a ground pin of the first inverter connect to the first clock signal, the second clock signal, a first source node, and a second source node, respectively; incorporating a second inverter configured to receive the second clock signal and output a third clock signal, wherein an input pin, an output pin, a power pin, and a ground pin of the second inverter connect to the second clock signal, the third clock signal, the first source node, and the second source node, respectively; incorporating a first resistor to couple a first DC voltage to the first source node; and incorporating a second resistor to couple a second DC voltage to the second source node. In an embodiment, the first inverter includes a PMOS (p-channel metal oxide semiconductor) transistor and a NMOS (n-channel metal oxide semiconductor) transistor, wherein a gate terminal and a source terminal of the PMOS transistor connect to the input pin and the power pin of the first inverter, respectively, while a gate terminal and a source terminal of the NMOS transistor connect to the input pin and the ground pin of the first inverter, respectively. In an embodiment, the second inverter includes a PMOS (p-channel metal oxide semicon- ductor) transistor and a NMOS (n-channel metal oxide semiconductor) transistor, wherein a gate terminal and a source terminal of the PMOS transistor connect to the input pin and the power pin of the second inverter, respectively, while a gate terminal and a source terminal of the NMOS transistor connect to the input pin and the ground pin of the second inverter, respectively. In an embodiment, the second inverter is substantially identical to the first inverter.

DETAILED DESCRIPTION OF THIS INVENTION

The present disclosure is directed to a clock buffer circuit and method for buffering a clock signal. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Persons of ordinary skill in the art understand terms and basic concepts related to microelectronics that are used in this disclosure, such as "circuit node," "power node," "ground node," "inverter," "PMOS transistor," "NMOS transistor," "resistor," "DC (direct current)," "noise," "flicker noise," "cascade," "differential signal," "differential pair," "single-ended," "common-mode," and "source degeneration." Terms and basic concepts like these are well known and understood to those of ordinary skill in the art and thus will not be explained in detail here. Those of ordinary skill in the art will also recognize circuit symbols, such as symbols of PMOS transistor and NMOS transistors, and understand what nodes comprise the "source," the "gate," and the "drain" terminals thereof.

Throughout this disclosure, a DC node is a circuit node of a substantially stationary electric potential.

Figure 1A:
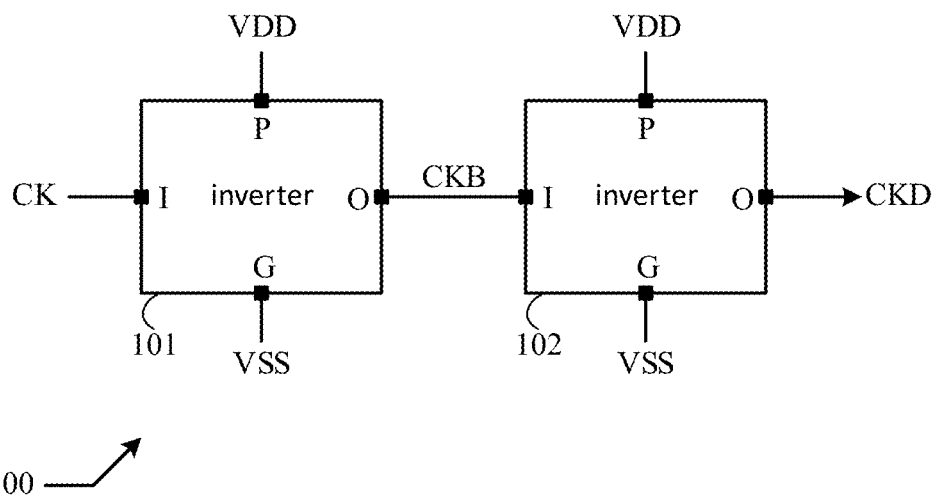
FIG. 1A shows a schematic diagram of a prior art clock buffer.
Figure 1B:
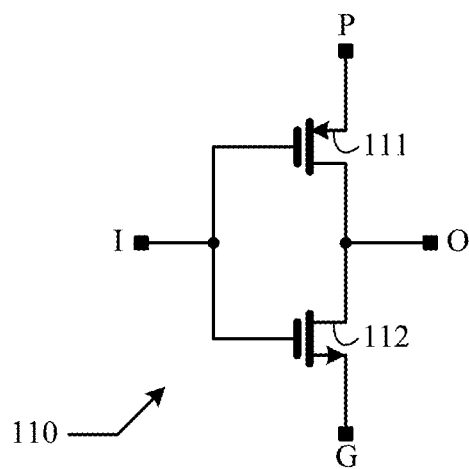
FIG. 1B shows a schematic diagram of a conventional inverter.
Figure 2:
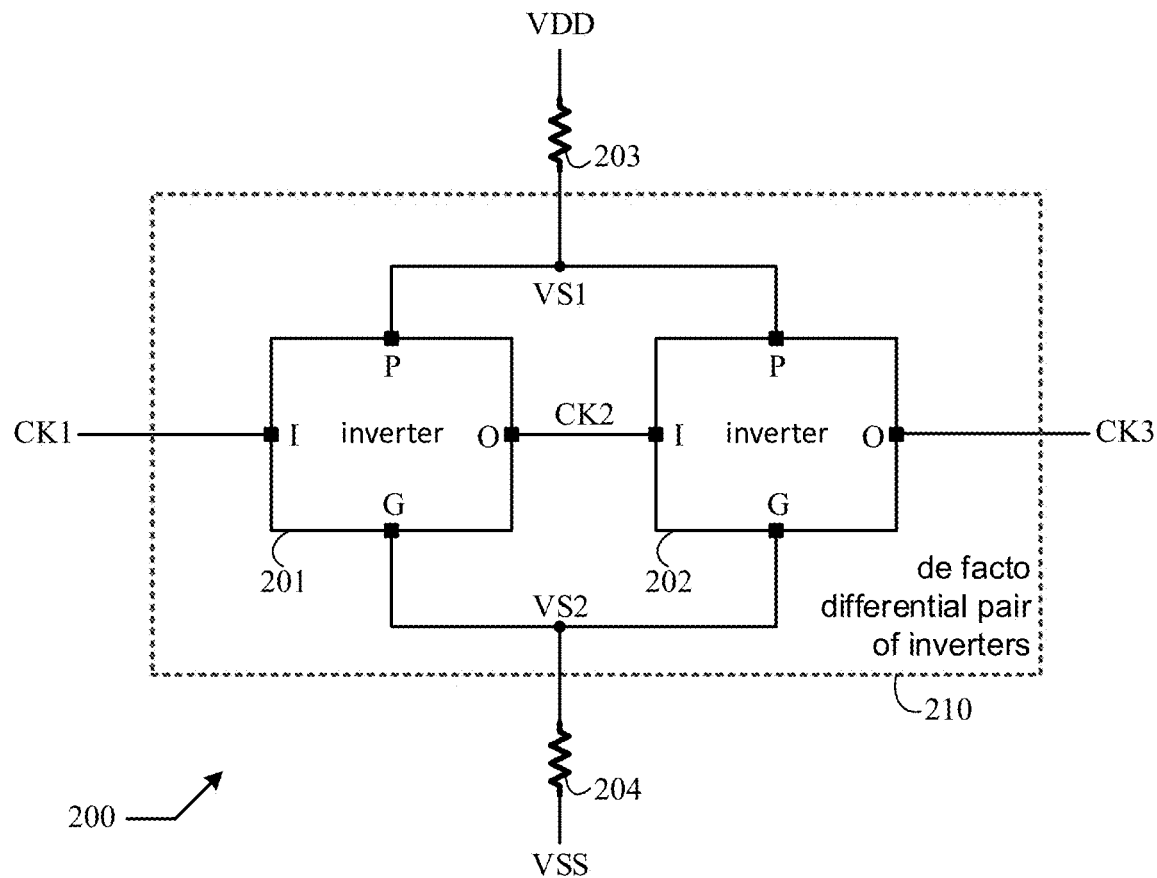
FIG. 2 shows a schematic diagram of a clock buffer in accordance with an embodiment of the present disclosure.

A schematic diagram of a clock buffer 200 in accordance with an embodiment of the present disclosure is depicted in FIG. 2. The clock buffer 200 comprises a first inverter 201 configured to receive a first clock signal CK1 and output a second clock signal CK2, a second inverter 202 configured to receive the second clock signal CK2 and output a third clock signal CK3, a first resistor 203 connected between a power node VDD to a first source node VS1, and a second resistor 204 connected between a ground node VSS to a second source node VS2, in which an input pin labeled by "I," an output pin labeled by "O," a power pin labeled by "P," and a ground pin labeled by "G" of the first inverter 201 connect to the first clock signal CK1, the second clock signal CK2, the first source node VS1, and the second source node VS2, respectively, while an input pin labeled by "I," an output pin labeled by "O," a power pin labeled by "P," and a ground pin labeled by "G" of the second inverter 201 connect to the second clock signal CK2, the third clock signal CK3, the first source node VS1, and the second source node VS2, respectively. In an embodiment, both the first inverter 201 and the second inverter 202 are two instances of inverter 110 of FIG. 1B. Clock buffer 200 differs from clock buffer 100 of FIG. 1A in that: the two inverters 101 and 102 in clock buffer 100 connect to the power node VDD (via their respective power pin "P") on the top side and to the ground node VSS (via their respective ground pin "G") on the bottom side, while the two inverters 201 and 202 in clock buffer 200 connect to the first source node VS1 (via their respective power pin "P") on the top side and to the second source node VS2 (via their respective ground pin "G") on the bottom side.

In other words, the two inverters 201 and 202 in clock buffer 200 indirectly connect to the power node VDD via the first resistor 203 on the top side and to the ground node VSS via the second resistor 204 on the bottom side. Compared with clock buffer 100 of FIG. 1A, clock buffer 200 of FIG. 2 is less susceptible to a noise at the power node VDD due to using the first resistor 203, which helps to alleviate the impact of the noise at the power node VDD, and is less susceptible to a noise at the ground node VSS due to using the second resistor 204 that helps to alleviate the impact of the noise at the ground node VSS. In addition, clock buffer 200 is also less susceptible to noises of its constituent inverters (i.e., inverters 201 and 202) due to a source degeneration function provided by the first resistor 203 and the second resistor 204. To be specific, for both the first inverter 201 and the second inverter 202 embodied by a respective instance of inverter 110 of FIG. 1B, the first resistor 203 provide a source degeneration for the PMOS transistor 111 and can effectively alleviate a flicker noise of the PMOS transistor 111, while the second resistor 204 provide a source degeneration for the NMOS transistor 112 and can effectively alleviate a flicker noise of the NMOS transistor 112. The concepts of "source degeneration", "flicker noise," and that "source degeneration can effectively alleviate a flicker noise of a MOS transistor" are all well known to those of ordinary skill in the art and thus not described in detail here.

Although the first resistors 203 and 204 can contribute noises themselves, the impacts of their noises are alleviated due to the tandem topology of the two inverters 201 and 202. The first inverter 201 receives the first clock signal CK1 and output the second clock signal CK2, therefore the second clock signal CK2 is an inversion of the first clock signal CK1. Consequently, the first clock signal CK1 and the second clock signal CK2 jointly form a de facto differential signal. The first inverter 201 and the second inverter 202 receives the first clock signal CK1 and the second clock signal CK2, respectively. Since CK1 and CK2 jointly form a de facto differential signal, the first inverter 201 and the second inverter 202 jointly form a de facto differential pair of inverters (labeled by 210). The first resistor 203, effectively shared by the two inverters 201 and 202, serves as a common-mode source degeneration resistor on the power side, while the second resistor 204, also effectively shared by the two inverters 201 and 202, serves as a common-mode source degeneration resistor on the ground side, for the de facto differential pair of inverters 210.

As far as the de facto differential pair of inverters 210 is concerned, noises from the first resistor 203 are a common-mode disturbance, and so are noises from the second resistor 204. Compared with a single-ended circuit, a differential circuit inherently has a better common-mode rejection, and thus less susceptible to a common-mode disturbance. In conclusion, clock buffer 200 can output a cleaner clock than clock buffer 100 due to having a better immunity to noises from the power node, the ground node, and the circuit components therein.

Note that both VS1 are VS2 are referred to as source nodes because both connect to a source terminal of a MOS transistor. To be specific, VS1 connects to the source of the PMOS transistor 111 via the power pin "P," while VS2 connects to the source of the NMOS transistor 112 via the ground pin "G," for the two instances of inverter 110 of FIG. 1B instantiated to embody the two inverters 201 and 202 of FIG. 2, respectively.

By way of example but not limitation: clock buffer 200 is fabricated using a 28 nm CMOS (complementary metal oxide semiconductor) process; the first inverter 201 and the second inverter 202 are substantially identical; VDD is of a first DC voltage 1.05V with a dynamic fluctuation less than 20 mV (and thus said to be substantially stationary); VSS is of a second DC voltage 0V with a dynamic fluctuation less than 5 mV (and thus said to be substantially stationary); the width and length of PMOS transistor 111 of FIG. 1B are 48 microns and 30 nm, respectively; the width and length of NMOS transistor 112 of FIG. 1B are 40 microns and 30 nm, respectively; and the two resistors 203 and 204 are both 200-Ohm.

Note that inverter 110 of FIG. 1B is just an exemplary embodiment of an inverter. Other inverter circuits can be used to embody inverters 201 and 202 of FIG. 2 at the discretion of circuit designers.

Figure 3:
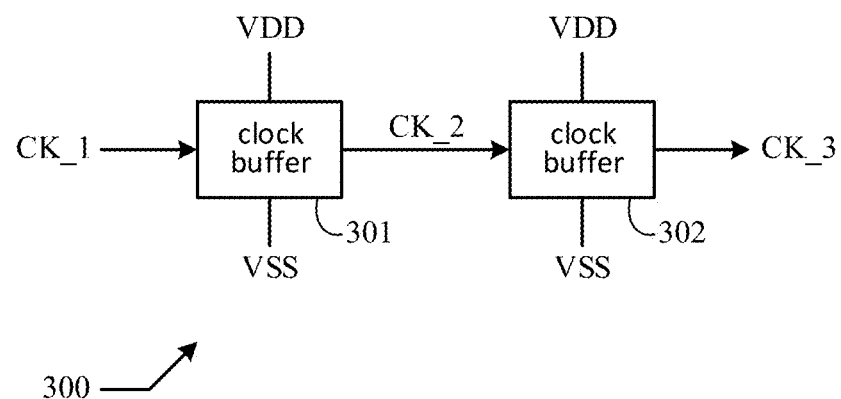
FIG. 3 shows a schematic diagram of a two-stage cascade clock buffer.

For some applications, a deliberate delay of a clock signal is needed. In this case, a plurality of clock buffers 200 configured in a cascade topology can be employed. FIG. 3 depicts a schematic diagram of a two-stage cascade clock buffer 300 comprising a first clock buffer 301 configured to receive a first clock signal CK_1 and output a second clock signal CK_2, and a second clock buffer 302 configured to receive the second clock signal CK_2 and output a third clock signal CK_3, wherein the first clock buffer 301 and the second clock buffer 302 are two instances of clock buffer 200 of FIG. 2.

Figure 4:
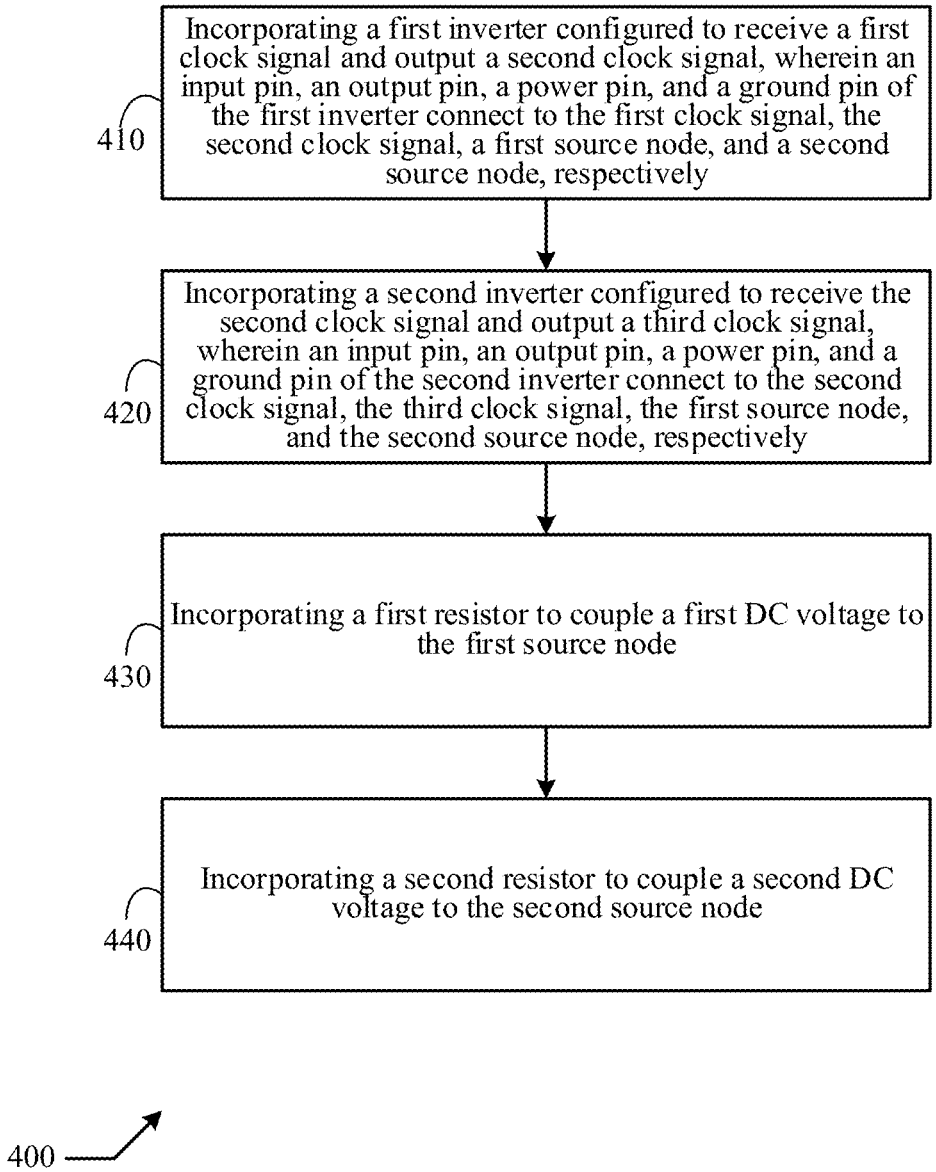
FIG. 4 shows a flow diagram of a method in accordance with the present disclosure.

As illustrated by a flow diagram 400 shown in FIG. 4, a method includes: incorporating a first inverter configured to receive a first clock signal and output a second clock signal, wherein an input pin, an output pin, a power pin, and a ground pin of the first inverter connect to the first clock signal, the second clock signal, a first source node, and a second source node, respectively (step 410); incorporating a second inverter configured to receive the second clock signal and output a third clock signal, wherein an input pin, an output pin, a power pin, and a ground pin of the second inverter connect to the second clock signal, the third clock signal, the first source node, and the second source node, respectively (step 420); incorporating a first resistor to couple a first DC voltage to the first source node (step 430); and incorporating a second resistor to couple a second DC voltage to the second source node (step 440).

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A clock buffer circuit comprising:
   a first inverter configured to receive a first clock signal and output a second clock signal, wherein an input pin, a power pin, and a ground pin of the first inverter directly connect to the first clock signal, a first source node, and a second source node, respectively, and wherein an output pin of the first inverter generates the second clock signal;
   a second inverter configured to receive the second clock signal and output a third clock signal, wherein an input pin, a power pin, and a ground pin of the second inverter directly connect to the second clock signal, the first source node, and the second source node, respectively, and wherein an output pin of the second inverter generates the third clock signal;
   a first resistor directly connected between a first DC (direct-current) voltage and the first source node; and
   a second resistor directly connected between a second DC voltage and the second source node,
   wherein the first source node is connected to the first DC voltage only through the first resistor, and the second source node is connected to the second DC voltage only through the second resistor, thereby configuring the circuit to have improved noise immunity.

2. The clock buffer circuit of claim 1, wherein the first inverter includes a PMOS (p-channel metal oxide semiconductor) transistor and a NMOS (n-channel metal oxide semiconductor) transistor, wherein a gate terminal and a source terminal of the PMOS transistor connect to the input pin and the power pin of the first inverter, respectively, while a gate terminal and a source terminal of the NMOS transistor connect to the input pin and the ground pin of the first inverter, respectively.

3. The clock buffer circuit of claim 1, wherein the second inverter includes a PMOS (p-channel metal oxide semiconductor) transistor and a NMOS (n-channel metal oxide semiconductor) transistor, wherein a gate terminal and a source terminal of the PMOS transistor connect to the input pin and the power pin of the second inverter, respectively, while a gate terminal and a source terminal of the NMOS transistor connect to the input pin and the ground pin of the second inverter, respectively.

4. The clock buffer circuit of claim 1, wherein the second inverter is substantially identical to the first inverter.

5. A method for improving noise immunity in a clock buffer circuit comprising:
   incorporating a first inverter configured to receive a first clock signal and output a second clock signal, wherein an input pin, a power pin, and a ground pin of the first inverter directly connect to the first clock signal, a first source node, and a second source node, respectively, and wherein an output pin of the first inverter generates the second clock signal;
   incorporating a second inverter configured to receive the second clock signal and output a third clock signal, wherein an input pin, a power pin, and a ground pin of the second inverter directly connect to the second clock signal, the third clock signal, the first source node, and the second source node, respectively, and wherein an output pin of the second inverter generates the third clock signal;
   incorporating a first resistor to directly connect a first DC voltage to the first source node; and
   incorporating a second resistor to directly connect a second DC voltage to the second source node,
   wherein the first source node is connected to the first DC voltage only through the first resistor and the second source node is connected to the second DC voltage only through the second resistor, thereby configuring the circuit to have improved noise immunity.

6. The method of claim 5, wherein the first inverter includes a PMOS (p-channel metal oxide semiconductor) transistor and a NMOS (n-channel metal oxide semiconductor) transistor, wherein a gate terminal and a source terminal of the PMOS transistor connect to the input pin and the power pin of the first inverter, respectively, while a gate terminal and a source terminal of the NMOS transistor connect to the input pin and the ground pin of the first inverter, respectively.

7. The method of claim 5, wherein the second inverter includes a PMOS (p-channel metal oxide semiconductor) transistor and a NMOS (n-channel metal oxide semiconductor) transistor, wherein a gate terminal and a source terminal of the PMOS transistor connect to the input pin and the power pin of the second inverter, respectively, while a gate terminal and a source terminal of the NMOS transistor connect to the input pin and the ground pin of the second inverter, respectively.

8. The method of claim 5, wherein the second inverter is substantially identical to the first inverter.

* * * * *